United States Patent [19]

Lee

[11] Patent Number: 5,288,666
[45] Date of Patent: Feb. 22, 1994

[54] PROCESS FOR FORMING SELF-ALIGNED TITANIUM SILICIDE BY HEATING IN AN OXYGEN RICH ENVIRONMENT

[75] Inventor: Steven S. Lee, Colorado Springs, Colo.

[73] Assignee: NCR Corporation, Dayton, Ohio

[21] Appl. No.: 496,720

[22] Filed: Mar. 21, 1990

[51] Int. Cl.$^5$ .......................................... H01L 21/44
[52] U.S. Cl. ..................... 437/200; 437/40; 437/189; 148/DIG. 141; 148/DIG. 147
[58] Field of Search ........... 148/DIG. 147, DIG. 141; 437/200, 40, 189

[56] References Cited

U.S. PATENT DOCUMENTS

| | | | |
|---|---|---|---|
| Re. 32,207 | 7/1986 | Levinstein et al. | 437/200 |
| 4,425,700 | 1/1984 | Sasaki et al. | 437/200 |
| 4,495,219 | 1/1985 | Kato et al. | 437/235 |
| 4,521,952 | 6/1985 | Riseman | 437/200 |
| 4,577,396 | 3/1986 | Yamamoto et al. | |
| 4,581,623 | 4/1986 | Wang . | |
| 4,581,815 | 4/1986 | Cheung et al. | |
| 4,587,718 | 5/1986 | Haken et al. | |
| 4,593,454 | 6/1986 | Baudrant et al. | 437/200 |
| 4,612,258 | 9/1986 | Tsang | 437/200 |
| 4,619,038 | 10/1986 | Pintchowski . | |
| 4,635,347 | 1/1987 | Lien et al. | |
| 4,641,417 | 2/1987 | McDavid . | |
| 4,660,276 | 4/1987 | Hsu | 437/200 |
| 4,673,968 | 6/1987 | Hieber et al. | 437/200 |
| 4,715,109 | 12/1987 | Bridges . | |
| 4,724,223 | 2/1988 | Ditchek . | |
| 4,784,973 | 11/1988 | Stevens et al. | |
| 4,788,160 | 11/1988 | Havemann et al. | |
| 4,804,438 | 2/1987 | Rhodes | 437/201 |
| 4,923,822 | 5/1990 | Wang et al. | 437/200 |
| 5,075,251 | 12/1991 | Torres et al. | 437/200 |

FOREIGN PATENT DOCUMENTS 2636472 3/1990 France .

OTHER PUBLICATIONS

J. Torres et al., "Control of a Self-Aligned W. Silicide Process by Annealing Ambience," *Journal De Physique Colloq.*, vo. 49, No. C-4, pp. 183-186, Sep. 1988.
A. Kiruchi & T. Ishiba, "Role of Oxygen and Nitrogen in the Titanium-Silicon Reaction," *Journal of Applied Physics*, vol. 61, No. 5 3(1987) pp. 1891-1894.

*Primary Examiner*—Brian E. Hearn
*Assistant Examiner*—Laura M. Holtzman
*Attorney, Agent, or Firm*—Douglas S. Foote

[57] ABSTRACT

A process for producing self-aligned titanium silicide. A silicon substrate is provided, silicon electrode and oxide insulator regions are formed on the substrate, and a titanium layer overlying the electrode and insulator regions is formed. The device is heated in an oxygen rich environment to form titanium silicide overlying the electrode regions and to form titanium oxide overlying the insulator regions and metal silicide.

17 Claims, 1 Drawing Sheet

PROCESS FOR FORMING SELF-ALIGNED TITANIUM SILICIDE BY HEATING IN AN OXYGEN RICH ENVIRONMENT

The present invention relates to a process for forming a metal silicide on a silicon surface. More particularly, it relates to a process for forming self-aligned titanium silicide on semiconductor electrode regions for reduced electrical resistance.

BACKGROUND OF THE INVENTION

The development of integrated circuits has been characterized by the ever increasing number of devices placed on a single semiconductor substrate. In order to achieve higher device density, smaller geometry devices have been developed. Predictably, a number of structural and operational problems arise when conventional lower density designs and processes are scaled down in an attempt to achieve the desired device size. Two such problems in small geometry MOS devices are so-called short channel effects and the relatively high resistivity of silicon.

The problem of short channel effects is created, in part, by electrical interference between the MOS gate field and the doped source and drain regions. The interference can lead to electron tunneling between source, drain and gate regions. One solution to reduce short channel effects is to create lightly doped drain/source (LDD) regions on the side of the drain and source regions, respectively, proximate the gate location. Electrical interference from the gate field is thereby lowered reducing electron tunneling. U.S. Pat. Nos. 4,701,423 and 4,703,551 discuss in greater detail short channel effects and the use of LDD regions.

The relatively high resistance of silicon is a problem because both the doped single crystal silicon source and drain regions and polysilicon gate region carry current. The relatively high resistance of silicon is generally not a problem with large scale integrated circuits due to the relatively large cross section for carrying current. However, with very large scale integrated circuits the current carrying cross section is reduced thereby increasing the effective device resistance. Increased sheet resistance affects device performance by slowing down device response time. One solution to this problem is to provide a metal silicide layer, such as titanium silicide, on top of the silicon source and drain regions and the polysilicon gate.

In the past, the formation of titanium silicide has been achieved by a three step process. First, a layer of titanium silicide is deposited over the entire semiconductor structure including silicon and oxide regions and the structure is subjected to a low temperature anneal in the presence of nitrogen. This creates a layer of titanium silicide overlying the silicon regions and a layer of titanium nitride overlying the entire structure. Second, the titanium nitride and any nonreacted titanium is removed by means of a selective chemical etch thereby preventing the titanium nitride or nonreacted titanium from conductively interconnecting the titanium silicide on the electrode regions. Third, the device is subjected to a high temperature anneal to stabilize the titanium silicide and reduce the titanium silicide resistance to its final value.

The resulting titanium silicide is self-aligned with respect to the underlying silicon electrode regions. What is meant by "self-aligned" is that there is no masking step required to align the titanium silicide with the silicon electrode regions. The chemical reaction forms titanium silicide only where the titanium overlies exposed silicon.

The cost of producing a semiconductor device bears a proportional relationship to the number of processing steps required to form the device. Moreover, each additional processing step has the potential for introducing impurities and/or for adversely affecting the integrity of previously formed device structure. Thus, the reduction of processing steps is highly desirable, particularly if it can be achieved without affecting the quality of the device.

OBJECTS OF THE INVENTION

It is therefore an object of the present invention to provide a new and improved process for forming self-aligned titanium silicide.

It is another object of the present invention to provide a process for selectively forming a metal silicide on a silicon surface.

It is a further object of the present invention to provide a single-step process for forming titanium silicide on a silicon surface.

It is yet another object of the present invention to provide a new and improved process for producing a semiconductor device.

It is yet a further object of the present invention to provide a process for forming low electrical resistance electrodes for a semiconductor device.

SUMMARY OF THE INVENTION

The present invention is a process for selectively forming a metal silicide on a silicon surface. After a layer of metal is formed on the silicon surface, the metal and silicon are heated in an oxygen rich environment to form the metal silicide and an overlying layer of metal oxide.

Another form of the present invention is a process for producing a semiconductor device. A silicon substrate is provided, silicon electrode and oxide insulator regions are formed on the substrate, and a metal layer overlying the electrode and insulator regions is formed. The device is heated in an oxygen rich environment to form metal silicide overlying the electrode regions and to form metal oxide overlying the insulator regions and metal silicide. In a preferred embodiment, the metal is titanium.

DESCRIPTION OF A PREFERRED EMBODIMENT

Figure 1:
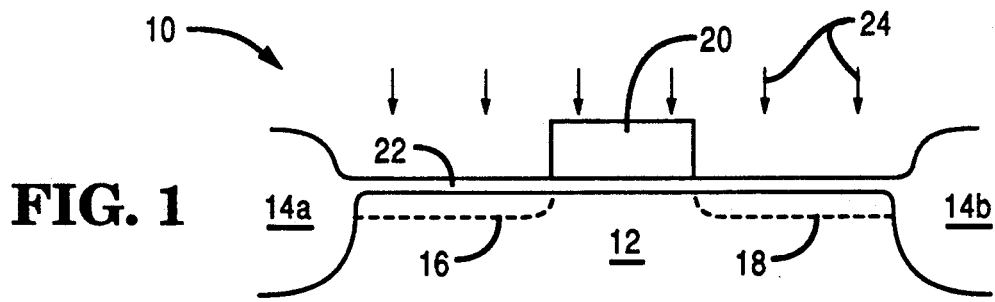
FIGS. 1-6 are schematic cross-sectional views of a MOSFET taken sequentially during selected processing steps according to one form of the present invention. The processing steps include a single-step formation of self-aligned titanium silicide.

Referring to FIG. 1, an early stage of the formation of a semiconductor device 10 is shown. Device 10 includes a single crystal silicon substrate 12 of either n or p type. Field oxide REGIONS 14A AND 14b are formed according to any of a number of conventional processes. For example, a local oxidation of silicon (LOCOS) process may be employed. Field oxide regions 14a and 14b bound an active region which will include various electrode regions. For example, the electrode regions may include a source region 16, a drain region 18 and a gate region 20. After insulating field oxide regions 14a and 14b are formed, the surface of silicon substrate 12 is cleaned and a gate oxide layer 22 is formed by heating device 10 in an oxygen rich environment. An oxygen rich environment is one in which oxygen is the predominate and only reactive element. Thus, an oxygen rich environment contains either pure oxygen or a mixture of at least 50% oxygen and non-reactive elements such as nitrogen and/or argon. Polycrystalline silicon (polysilicon) is deposited on gate oxide 22 and patterned to form gate region 20.

Device 10 is next subjected to a low dose, low energy LDD ion implant 24. The ion implant lightly dopes substrate 12 at regions 16 and 18 underlying gate oxide 22 and between gate region 20 and field oxide regions 14a and 14b, respectively.

Figure 2:
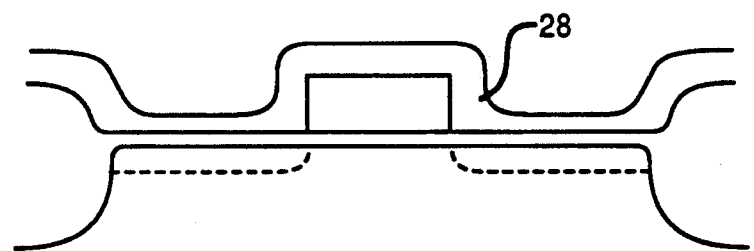

FIG. 2 shows the formation of an oxide layer 28 such as may be achieved by chemical vapor deposition. Alternatively, layer 28 may be a deposited nitride layer. Layer 28 is next subjected to an anisotropic etch, for example a reactive ion etch (RIE). The RIE removes oxide layer 28 and gate oxide 22 to a uniformly defined depth.

Figure 3:

As shown in FIG. 3, the anisotropic etching of the oxide is terminated while there are still insulating spacer oxide regions 30a and 30b remaining on the sidewalls 32a and 32b, respectively, of gate region 20. The oxide on top of gate region 20 as well as the oxide adjacent sidewalls 32a and 32b and overlying source region 16 and drain region 18 removed. Source region 16 and drain region 18 are then subjected to a further ion implant which increases their doping. Adjacent LDD regions 16a and 16b are protected from further doping by overlying oxide regions 30a and 30b. It will be noted that the location of source region 16 and drain region 18 are defined by the position of oxide regions 30a and 30b.

Figure 4:
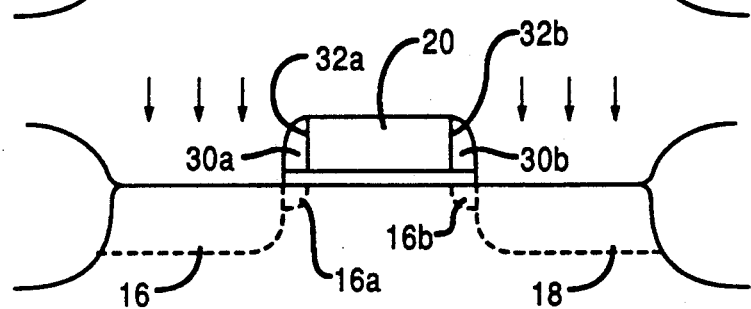

FIG. 4 shows a metal layer 34 deposited on device 10 so that it overlies silicon and oxide regions alike. It should be clear that silicon regions include source, drain and gate regions 16, 18 and 20, respectively. Oxide regions include field oxide regions 14a and 14b and spacer oxide regions 30a and 30b. Preferably, the metal for layer 34 is a transition metal such as titanium, cobalt, platinum, palladium, molybdenum, tantalum or nickel. In a preferred embodiment the metal is titanium.

Figure 5:
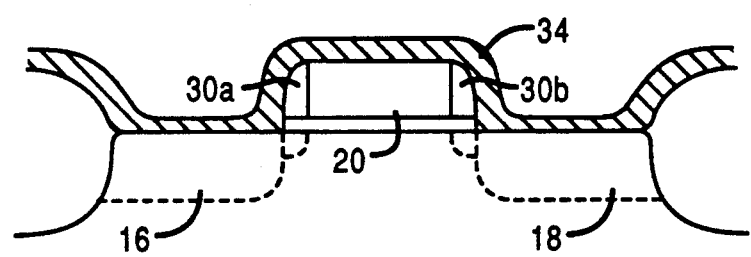

Device 10 is then heated in an oxygen rich environment so that the titanium will react with underlying silicon to form titanium silicide 36. If device 10 is heated by rapid thermal processing (RTP), the preferred temperature is at least 650 degrees C. for at least 10 seconds. If device 10 is heated in a conventional oven, the preferred temperature is at least 580 degrees C. for at least 10 minutes. In either situation, the heating will be conducted at a temperature and for a time sufficient to stabilize the titanium silicide and titanium oxide. As shown in FIG. 5, titanium silicide 36 is formed over source region 16, drain region 18 and gate region 20. Since titanium silicide is only formed where the underlying material is silicon, the titanium silicide is self-aligned with respect to the regions 16, 18 and 20. The titanium will react with the oxygen rich atmosphere to form an overlying titanium oxide layer 38. Titanium oxide layer 38 overlies titanium silicide 36, field oxide 14a and 14b, and oxide spacer regions 30a and 30b.

In the past, self-aligned titanium silicide has been formed by a three step process.

1. The device is heated at a relatively low temperature in the presence of nitrogen or argon (no oxygen) after the layer of titanium is deposited. This forms a titanium silicide layer over underlying silicon regions and an overlying layer of titanium nitride or pure titanium. Such oxygen free, low temperature annealing of metal on silicon generally requires a temperature less than 700 degrees C.

2. Unlike the overlying layer of titanium oxide in the subject invention which electrically insulates the underlying titanium silicide, the titanium nitride or titanium is conductive. In order to prevent leakage between electrodes, a further processing step to remove the titanium nitride and any nonreacted titanium is performed.

3. The device is then subjected to a further high temperature annealing, greater than 700 degrees C., before insulating material is applied.

In contrast to this three step process, the subject invention provides an equivalent structure in a single-step. As noted previously, the single annealing step of the present invention is performed at a preferred temperature greater than 650 degrees C. (RTP) or 580 degrees C. (conventional oven). Generally, the temperature is greater than the conventional oxygen free, low temperature annealing of metal on silicon.

Figure 6:
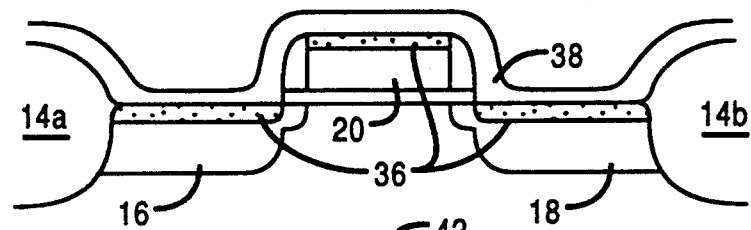

FIG. 6 shows device 10 after further processing. More particularly, an electrically insulating layer 40 is formed over oxide layer 38. In a preferred embodiment, insulating layer 40 is a phosphosilicate glass (PSG) or boron phosphosilicate glass (BPSG). Conventional lithographic and etching techniques are used to open windows in insulating layer 40 and titanium oxide layer 38 overlying source region 16, drain region 18 and gate region 20. Metal 42 is then formed in these windows to provide electrical contact to the titanium silicide 36.

During operation of device 10, a voltage is applied to polysilicon gate 20 to provide a channel for current flow between source 16 and drain 18. The reduced electrical resistance of source region 16 and drain region 18 owing to the presence of titanium silicide 36 provides increased speed and performance of device 10. Gate region 20 is in some configurations connected to the gates of adjacent devices. In such configuration, titanium silicide 36 covering the adjacent, connected gates similarly lowers their electrical resistance.

It will be clear to those skilled in the art that the present invention is not limited to the specific embodiment disclosed and illustrated herein. Nor is the invention limited to a process for forming the particular semiconductor device 10 shown in the Figures. Rather, the invention in a broader sense encompasses a process for selectively forming a metal silicide on a silicon surface by providing a layer of metal on the surface and heating the metal and silicon in an oxygen rich environment.

It will be understood that the dimensions and proportional and structural relationships shown in the drawings are illustrated by way of example only and these illustrations are not to be taken as the actual dimensions or proportional structural relationships used in the formation of a structure according to the process of the present invention.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A process for producing a semiconductor device comprising:

providing a silicon substrate;
forming silicon electrode and oxide insulator regions on said substrate;
forming a metal layer overlying said electrode and insulator regions;
heating said device in an oxygen rich environment to form metal silicide overlying said electrode regions and to form metal oxide overlying said insulator regions ad metal silicide; and
forming an electrically insulating layer over said metal oxide.

2. The process of claim 1 wherein said electrode regions include doped source and drain regions in said substrate and a polysilicon gate region separated from said substrate by a gate oxide layer.

3. The process of claim 2 wherein said insulator regions include spacer regions adjacent to sidewalls of said gate region.

4. The process of claim 3 wherein said electrode regions further include lightly doped source and drain regions in said substrate below said spacer regions.

5. The process of claim 4 wherein said metal silicide reduces electrical resistance of said electrodes and said metal oxide metal electrically insulates the underlying metal silicide.

6. The process of claim 1 wherein said device is heated to a temperature higher than 580 degrees C.

7. The process of claim 1 wherein said metal is a transition metal.

8. The process of claim 7 wherein said transition metal is titanium, cobalt, platinum, palladium, molybdenum, tantalum or nickel.

9. The process of claim 8 further comprising:
opening windows in said insulating layer and metal oxide; and
forming metal in said windows to provide electrical contact to said metal silicide.

10. A process for producing a semiconductor device comprising:
providing a silicon substrate;
forming doped source and drain regions in said substrate, a polysilicon gate region separated rom said substrate by a gate oxide layer, insulating spacer regions adjacent to sidewalls of said gate region, and lightly doped source and drain regions in said substrate below said spacer regions;
forming a titanium layer overlying said source, drain, gate and sidewall regions;
heating said device above 580 degrees C. in an oxygen rich environment to form titanium silicide overlying said source, drain and gate regions thereby reducing their electrical resistance, and to form titanium oxide overlying said spacer regions and titanium silicide thereby electrically insulating the underlying titanium silicide;
forming an electrically insulating layer over said titanium oxide;
opening windows in said insulating layer and titanium oxide; and
forming metal in said windows to provide electrical contact to said titanium silicide.

11. A process for forming self-aligned metal silicide layers over source, drain and gate regions of a MOS semiconductor device comprising:
providing a silicon substrate;
forming field oxide regions to bound said source, drain and gate regions;
forming a gate oxide on said substrate;
forming a polysilicon gate region on said gate oxide;
lightly doping said substrate underlying said gate oxide and between said gate and field oxide regions to define low dopant drain/source (LDD) regions and to define said source and drain regions;
forming spacer oxide regions on the sidewalls of said gate region and overlying said LDD regions, removing said gate oxide adjacent said sidewalls and overlying said source and drain regions, and further doping said source and drain regions;
depositing a metal layer on said device; and
heating said device in an oxygen rich environment to form metal silicide overlying said source, drain and gate regions and to form metal oxide overlying said metal silicide and said field and spacer oxide regions; and
forming an electrically insulating layer over said metal oxide.

12. The process of claim 11 wherein said device is heated to a temperature higher than 580 degrees C.

13. The process of claim 12 wherein said metal is a transition metal.

14. The process of claim 13 wherein said transition metal is titanium, cobalt, platinum, palladium, molybdenum, tantalum or nickel.

15. The process of claim 14 further comprising:
opening windows in said insulating layer and metal oxide; and
forming metal in said windows to provide electrical contact to said metal silicide.

16. A process for producing a semiconductor device comprising:
forming a metal layer over silicon and insulator regions;
heating said layer in an oxygen rich environment to form:
metal silicide over said silicon region; and
metal oxide over said insulator region and metal silicide; and
selectively removing some but not all of the metal oxide which is over said metal silicide.

17. The process of claim 16 wherein said metal is titanium.

* * * * *

UNITED STATES PATENT AND TRADEMARK OFFICE
CERTIFICATE OF CORRECTION

PATENT NO. : 5,288,666

DATED : February 22, 1994

INVENTOR(S) : Steven S. Lee

It is certified that error appears in the above-identified patent and that said Letters Patent is hereby corrected as shown below:

Column 5 line 43, "rom" should be --from--.

Signed and Sealed this

Second Day of August, 1994

BRUCE LEHMAN

*Attest:*

*Attesting Officer*     *Commissioner of Patents and Trademarks*